United States Patent
Yoshida et al.

(10) Patent No.: US 7,080,993 B2
(45) Date of Patent: Jul. 25, 2006

(54) SPIRAL CONTACTOR, CONTACT SHEET HAVING SPIRAL CONTACTOR, AND CONNECTING DEVICE HAVING CONTACT SHEET

(75) Inventors: Shin Yoshida, Miyagi-ken (JP); Taiji Okamoto, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/077,277

(22) Filed: Mar. 9, 2005

(65) Prior Publication Data

US 2005/0208796 A1  Sep. 22, 2005

(30) Foreign Application Priority Data

Mar. 19, 2004 (JP) ............................... 2004-079745

(51) Int. Cl.
*H01R 12/00* (2006.01)
(52) U.S. Cl. ........................................................ 439/82
(58) Field of Classification Search .................. 439/82, 439/81, 78
See application file for complete search history.

(56) References Cited

U.S. PATENT DOCUMENTS

| | | | | |
|---|---|---|---|---|
| 4,961,709 | A * | 10/1990 | Noschese ..................... | 439/66 |
| 5,810,609 | A | 9/1998 | Faraci et al. .................. | 439/71 |
| 6,354,845 | B1 * | 3/2002 | Wolf et al. .................... | 439/75 |
| 6,517,362 | B1 | 2/2003 | Hirai et al. | |
| 6,887,085 | B1 * | 5/2005 | Hirai ............................ | 439/82 |
| 2002/0037657 | A1 * | 3/2002 | Hirai et al. ................... | 439/82 |
| 2003/0060064 | A1 * | 3/2003 | Hirai et al. ................... | 439/82 |
| 2004/0185694 | A1 * | 9/2004 | Hirai ............................ | 439/82 |

FOREIGN PATENT DOCUMENTS

| | | |
|---|---|---|
| JP | 2002-175859 | 6/2002 |
| JP | 2003-78078 | 3/2003 |
| JP | 2004-12357 | 1/2004 |

\* cited by examiner

*Primary Examiner*—Gary F. Paumen

(74) *Attorney, Agent, or Firm*—Beyer, Weaver & Thomas, LLP.

(57) ABSTRACT

A supporting portion is provided only at a winding start portion side and an outside of the other part of a deforming portion other than the winding start portion side is opened. Thus, adjacent spiral contactors can be arranged to be close to each other. Therefore, a mounting density of a spiral contactor on a guide frame can be increased. Further, since the deforming portion can be arranged at an opened region, a width of the deforming portion can be widened. As a result, the spiral contactor having a large spring constant is provided.

5 Claims, 6 Drawing Sheets

SPIRAL CONTACTOR, CONTACT SHEET HAVING SPIRAL CONTACTOR, AND CONNECTING DEVICE HAVING CONTACT SHEET

BACKGROUND OF THE INVENTION

1. Field of the Invention

The present invention relates to a spiral contactor electrically connected to an electronic component having a connecting terminal such as a BGA or a LGA, and more particularly, to a spiral contactor, a contact sheet having the spiral contactor and a connecting device having the contact sheet, in which a spring constant and a mounting density per unit area can be increased.

2. Description of the Related Art

FIG. 7 is a plan view showing a part of a contact sheet having a spiral contactor of related art, and FIG. 8 is an enlarged plan view of the spiral contactor of the related art.

A contact sheet 1 shown in FIG. 7 has a guide frame 2 composed of a thin insulating sheet with a plurality of spiral contactors 3 regularly arranged on the guide frame 2 in vertical and horizontal directions. As shown in FIG. 8, each spiral contactor 3 is formed of a thin copper plate having substantially a square shape and has a supporting portion 3A which functions as an enclosure and a deforming portion 3B which is notched in a spiral shape in the supporting portion 3A.

The contact sheet 1 is mounted on an insulating substrate having a plurality of through holes regularly arranged in the vertical and horizontal directions. A conductive portion is formed at the periphery and inside of each through hole and the supporting portion 3A of each spiral contactor 3 is electrically fixed to the periphery of each through hole. Also, the deforming portion 3B is located on the through hole and can be elastically deformed in a penetrating direction of the through hole.

If external contactors such as a plurality of spherical contactors (BGA) or cone-shaped contactors CGA provided on a bottom surface of an electronic component such as an IC are tightly pressed in a state in which they are opposite to the plurality of the spiral contactors 3, the external contactors reach into the through holes while pressing the spiral contactors 3. At this time, since the deforming portion 3B of the spiral contactor 3 is elastically deformed and is wound around and contacted to the outside of the external contactor, each spherical contactor and each spiral contactor are electrically connected to each other.

As related art documents related to the above-mentioned spiral contactor, there are Japanese Unexamined Patent Application Publication Nos. 2002-175859, 2003-78078 and 2004-12357.

DISCLOSURE OF THE INVENTION

Problems to be Solved by the Invention

In the above-mentioned spiral contactor, since the deforming portion is pressed into the through hole in a state in which it is largely elastically deformed, it must have a large spring constant. To do so, a width W of the deforming portion 3B (in FIG. 8, an average width is indicated by W) must be as wide as possible.

However, since the spiral contactor 3 of the related art has a structure that the outer region of the deforming portion 3B is surrounded by the rectangular supporting portion 3A, there is a limit in widening the width of the deforming portion 3B.

On the other hand, if the outer dimension of the spiral contactor 3 is increased, that is, the vertical and horizontal dimensions of the supporting portion 3A are increased, the inner width of the deforming portion 3B can be widened, thereby increasing the spring constant of the deforming portion 3B. However, in this method, there is a problem in that the mounting density per unit area cannot be increased in the contact sheet 1.

In addition, as shown in FIG. 7, since the spiral contactors 3 are arranged such that the supporting portions 3A are adjacent to each other in the vertical and horizontal directions, there is a problem in that an electrical short circuit is apt to be generated at the adjacent supporting portions 3A.

That is, for example, as disclosed in Japanese Unexamined Patent Application Publication No. 2002-175859, each spiral contactor 3 is formed by performing a number of manufacturing processes of plating nickel or copper on a surface of an insulating base sheet such as polyimide and etching the copper plating. However, as shown in FIG. 7, in the etching process, often, the copper plating 3C is not entirely removed and remains on the insulating base sheet. In such a case, the adjacent supporting portions 3A may be electrically connected to each other by the remaining copper plating 3C.

Furthermore, when the external contactor of the electronic component is contacted to the deforming portion 3B of the spiral contactor and a power is applied thereto, the supporting portions 3A are electrically short-circuited through the copper plating 3C. As a result, there is a problem in that the electronic component is often damaged and the signal interferes.

SUMMARY OF THE INVENTION

Accordingly, the present invention has been made to solve the above-mentioned problems, and it is an object of the present invention to provide a spiral contactor and a contact sheet having the same, in which a mounting density per unit area and a spring constant can be increased.

Further, it is another object of the present invention to provide a contact sheet and a connecting device having the contact sheet, which can prevent the short circuit from generating between the supporting portions of the spiral contactors.

In order to achieve the above-mentioned objects, the present invention provides a spiral contactor having a deforming portion extending from a winding start portion provided at an outer circumference side of the deforming portion to a winding end portion provided at an inner circumference side of the deforming portion in a spiral shape and a supporting portion connected to the winding start portion provided at the outer circumference side of the deforming portion, wherein the supporting portion is provided at the winding start portion side and an outside of the deforming portion other than the winding start portion side is opened.

In the present invention, since the area occupied by the deforming portion can be increased, a deforming portion having a large width can be obtained. Therefore, a spring constant of the deforming portion can be increased.

In this case, it is preferable that a concave portion be formed at a side opposite to a side of the winding start portion provided in the supporting portion and an adjacent deforming portion be partially arranged in the concave portion.

In the above-mentioned means, since the spiral contactors can be arranged in a state in which a distance between the adjacent spiral contactors is decreased, the mounting density per unit area can be increased.

In addition, the present invention provides a contact sheet having the above-mentioned spiral contactor, comprising: a guide frame formed with a plurality of openings, wherein the supporting portion is fixed at a circumference of the opening and the deforming portion is arranged in the opening.

In this case, it is preferable that rows and columns are formed by a plurality of the spiral contactors arranged at a predetermined pitch, and the supporting portions of the spiral contactors arranged in a row direction of one column and the deforming portions of the spiral contactors arranged in a row direction of another column adjacent to one column be arranged to be opposite to each other.

In the present invention, the supporting portions of the spiral contactors can be prevented from being close to each other.

Further, the present invention provides a connecting device having the above-mentioned contact sheet, wherein an insulating substrate formed with a plurality of through holes and a contact sheet arranged so as to face at least one surface of the insulating substrate are provided, and the supporting portion of the spiral contactor is connected to a connecting portion provided at a circumference of the opening of the through hole.

According to the spiral contactor of the present invention, the supporting portion is provided only at the winding start portion of the deforming portion and a part other than the winding start portion side is opened. As a result, since the portion that is the supporting portion in the related art, that is, the opened region can be provided with the deforming portion, the area occupied by the deforming portion can be increased. Therefore, the width of the deforming portion can be increased, compared to the related art, thereby increasing the spring constant of the deforming portion.

Furthermore, the mounting density per unit area can be increased by arranging the deforming portion of another spiral contactor in the concave portion formed in the supporting portion.

In addition, in the contact sheet of the present invention, the supporting portion and the deforming portion are close to each other in the row direction and the distance between the supporting portions is increased in the column direction, thereby preventing the supporting portions from being connected to each other by the copper plating that is not entirely removed by the etching process in manufacturing.

DESCRIPTION OF THE PREFERRED EMBODIMENTS

Figure 1:
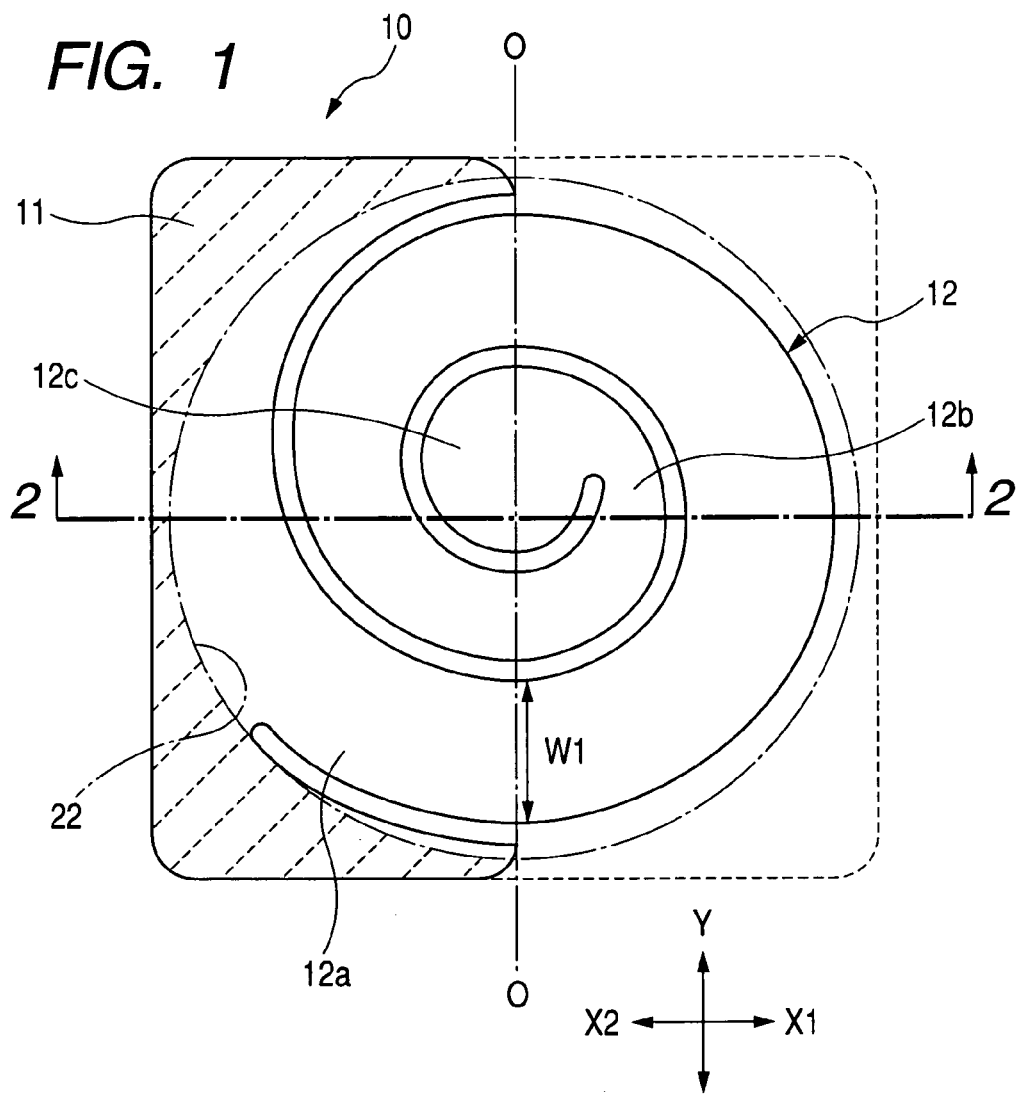
FIG. 1 is a plan view showing a spiral contactor according to a first embodiment of the present invention.
Figure 2:
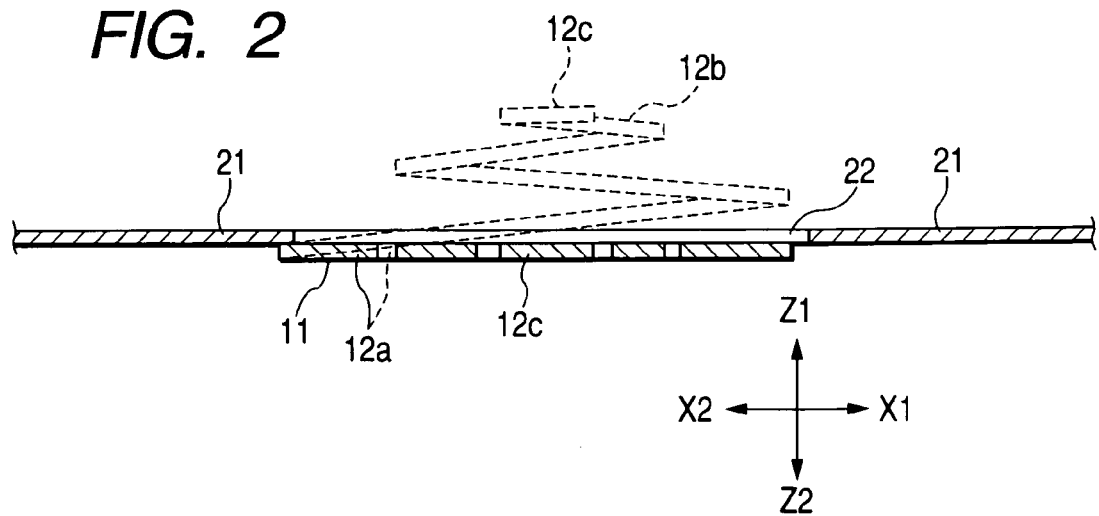
FIG. 2 is a cross-sectional view taken along the line II—II of FIG. 1.

FIG. 1 is a plan view of a spiral contactor according to a first embodiment of the present invention, and FIG. 2 is a cross-sectional view taken along the line II—II of FIG. 1.

A spiral contactor 10 shown in FIG. 1 has a supporting portion 11 and a deforming portion 12 formed in a spiral shape. The deforming portion 12 is provided with a winding start portion 12a at its outer circumference side and a winding end portion 12b at its inner circumference side which serves as a center of winding rotation. The supporting portion 11 is provided at the outer circumference of the deforming portion 12 and the winding start portion 12a of the deforming portion 12 continuously extends from the supporting portion 11. In addition, a front end of the winding end portion 12b has a large area and serves as a contacting portion 12c which is centrally contacted to the external contactor of an electronic component.

In the first embodiment shown in FIG. 1, the supporting portion 11 is provided only at a X2 side at which the winding start portion 12a is provided and the outside of the deforming portion 12 is opened at a X1 side at which the winding start portion 12a is not provided. In addition, in FIG. 1, the supporting portion 11 is formed up to a center line O—O parallel to the Y direction through a center of the contacting portion 12c.

For this reason, the deforming portion 12 can be arranged on the opened region of the X1 side (the outside region of the deforming portion 12) rather than at the center line O—O. Further, by forming the supporting portion 11 on a region of the winding start portion 12a (X2) side rather than at the center line O—O, an area occupied by the deforming portion 12 in the Y direction can increase.

Therefore, a width W1 of the deforming portion 12 from the winding start portion 12a to the winding end portion 12b can increase as a whole. As a result, when comparing the spiral contactors having the same external dimension, winding number, plate thickness and material, the spiral contactor 10 having a spring constant greater than those of the spiral contactors according to the related art can be obtained. Specifically, a spring constant greater than that of the related art can be obtained without increasing an overall external dimension of the spiral contactor 10. Therefore, even in the case of using the spiral contactor 10 having a large spring constant, it is not required for the overall external dimension to increase, thereby preventing a mounting density per unit area from decreasing in the case of arranging a plurality of spiral contactors.

In addition, since the supporting portion 11 is provided only at the winding start portion 12a side and the outside of the deforming portion 12 other than the winding start portion 12a is opened, the adjacent spiral contactors 10 can be arranged in a state in which they are more close to each other as compared to the related art. Therefore, it is possible to increase the mounting density of the spiral contactors.

Figure 8:
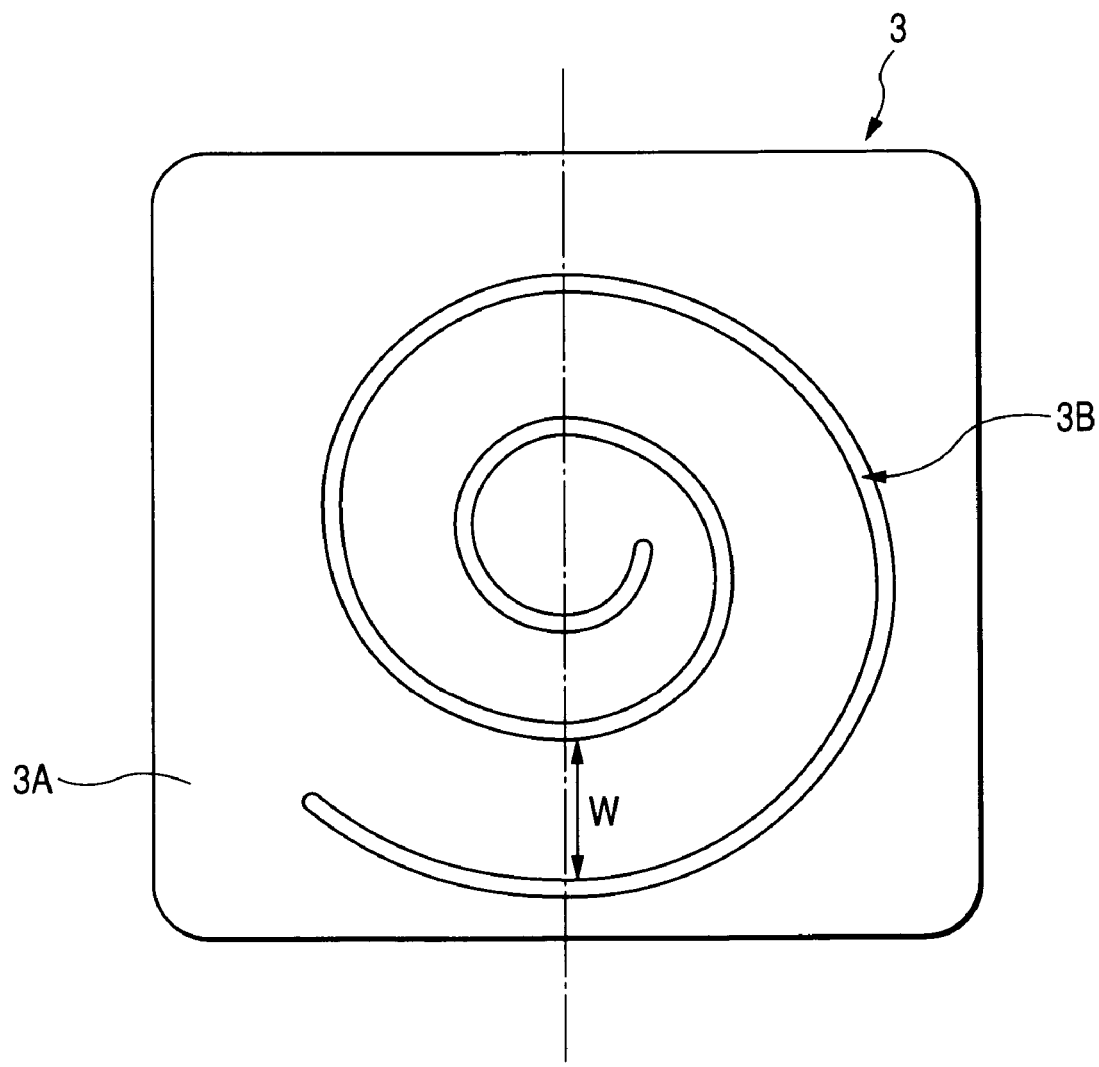
FIG. 8 is an enlarged plan view of the spiral contactor of the related art.

Furthermore, the width W1 indicates an average width of the spiral contactor 10 and corresponds to an average width W of a spiral contactor 3 according to the related art (see FIG. 8).

The spiral contactor 10 has a planar shape as shown by a solid line in FIG. 2. Alternatively, as shown by a dotted line in FIG. 2, a contacting portion 12c is formed so as to be elastically deformed in a cubic convex shape protruding in a Z1 direction of FIG. 2. In addition, the supporting portion 11 of the spiral contactor 10 is fixed to a guide frame 21 composed of an insulating sheet such as polyimide. Specifically, the guide frame 21 is formed with an opening 22 and the supporting portion 11 is attached to a rear surface of a circumference of the opening 22 (a surface of the Z2 side) by an adhesive. In addition, in FIG. 1, a part hatched by dotted lines is an overlap width of the adhesive.

As shown in FIG. 2, in the case in which the spiral contactor 10 has the planar shape, the deforming portion 12 is fixed so as to be opposite parallel to the opening 22. In addition, in the case in which the spiral contactor 10 has the cubic convex shape, the deforming portion 12 is fixed such that a front end thereof more protrudes in the surface (Z1) direction of the guide frame 21 through the opening 22 than the winding start portion 12a.

Figure 3:
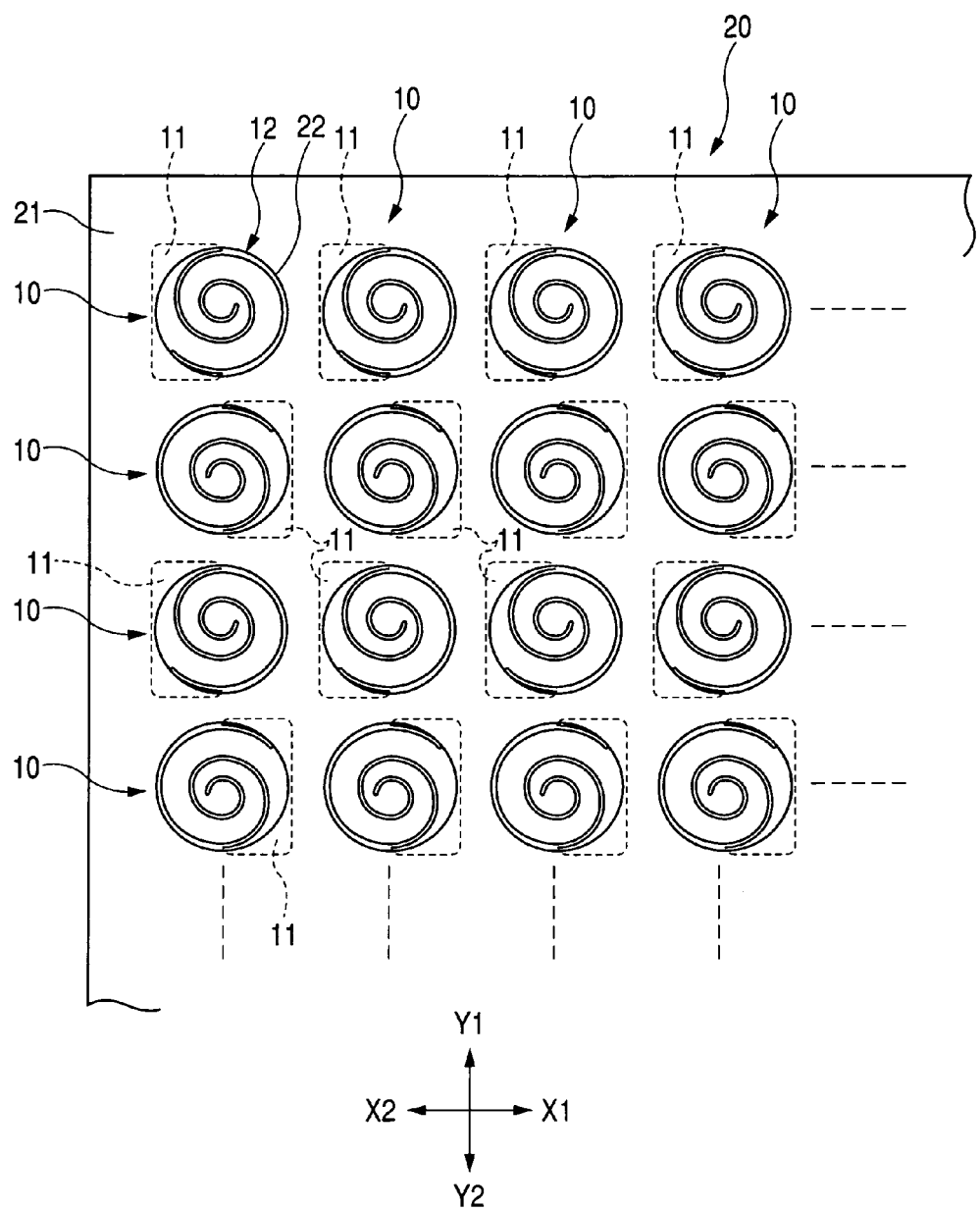
FIG. 3 is a plan view showing a contact sheet formed by using the spiral contactor of FIG. 1.

FIG. 3 is a plan view showing a contact sheet formed by using the spiral contactor of FIG. 1. In addition, in the description below, a horizontal (X) direction denotes a row and a vertical (Y) direction denotes a column.

As shown in FIG. 3, in the guide frame 21, a plurality of openings 22 is formed so as to be regularly arranged at a predetermined pitch in the row and column directions. Further, the contact sheet 20 is formed by correspondingly fixing one spiral contactor 10 to one opening 22.

Figure 4:
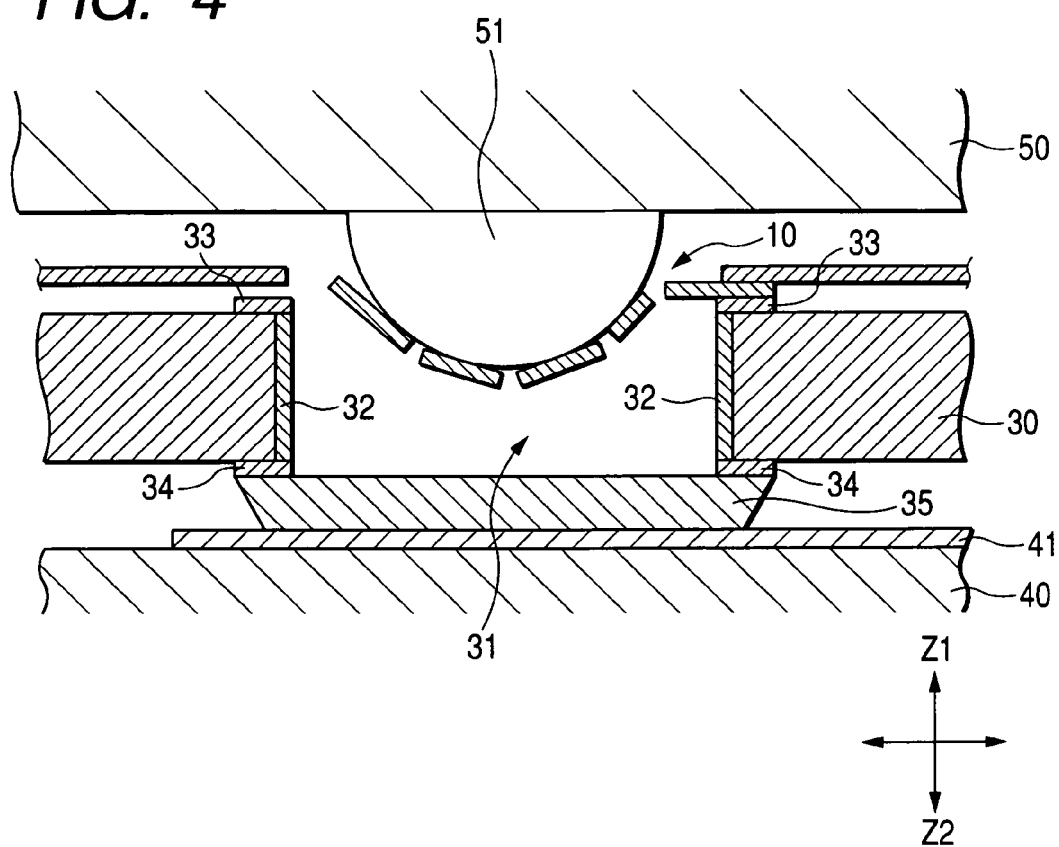
FIG. 4 is a cross-sectional view partially showing the contact sheet arranged on an insulating substrate.

FIG. 4 is a cross-sectional view partially showing the contact sheet arranged on the insulating substrate. The contact sheet 20 is positioned on an insulating substrate 30. In the insulating substrate 30, a plurality of through holes 31 is regularly arranged in the vertical and horizontal directions, and pitch dimensions of the vertical and horizontal directions between the adjacent through holes are equal to pitch dimensions of the vertical and horizontal directions of the adjacent spiral contactors 10 provided in the guide frame 21. Therefore, one through hole 31 is opposite to one spiral contactor 10.

As shown in FIG. 4, a conductive portion 32 formed by copper plating is formed at an inner surface of a through hole 31. Also, connecting portions 33 and 34 electrically connected to the conductive portion 32 are arranged at a periphery of upper and lower openings of the through hole 31. Further, one connecting portion 33 and the supporting portion 11 of the spiral contactor 10 are connected and fixed by a conductive adhesive.

Furthermore, a connecting terminal 35 is fixed to the other connecting portion 34 and is connected to each pattern line 41 of a plurality of pattern lines 41 which are provided under the insulating substrate 30 and formed on a wiring substrate 40 by a means of the above-mentioned conductive adhesive or soldering. Therefore, the spiral contactor 10 and the pattern line 41 are electrically connected to each other through one connecting portion 33, the conductive portion 32, the other connecting portion 34 and the connecting terminal 35. Specifically, the insulating substrate having the contact sheet and the through hole functions as a connecting device for electrically connecting the external contactor and the pattern line 41 of the wiring substrate 40. Also, the pattern line 41 is connected to an external circuit (not shown) provided at an outside and an electronic component 50 and the external circuit are connected to each other.

In addition, instead of the connecting terminal 35, a structure that the contact sheet 20 is positioned at a lower side of the insulating substrate 30 and the other connecting portion 34 and pattern line 41 are connected to each other by using the spiral contactor 10 provided at the contact sheet 20 may be considered.

As shown in FIG. 4, if an external contactor 51 such as a spherical contactor (BGA) provided at the electronic component 50 is pressed on the spiral contactor 10 in a Z2 direction, the deforming portion 12 of the spiral contactor 10 is contacted to surround an outer surface of the external contactor 51 while being elastically deformed in a concave shape. Therefore, the external contactor 51 of the electronic component 50 and the pattern line 41 can be electrically connected to each other.

As shown in FIG. 3, at the contact sheet 20, all the spiral contactors 10 of a first row are arranged in a state in which the supporting portions 11 face the X2 side. In addition, all the spiral contactors 10 of a second row adjacent to the first row are arranged in a state in which the supporting portions 11 face the X1 side. Also, all the spiral contactors 10 of a third row are arranged in a state in which the supporting portions 11 face the X2 side. Similarly, the spiral contactors 10 are provided at the guide frame 21 such that directions thereof are different from each other for each adjacent row. Specifically, in the contact sheet 20, the spiral contactors 10 are arranged in a zigzag shape such that the directions thereof are different to each other.

Figure 7:
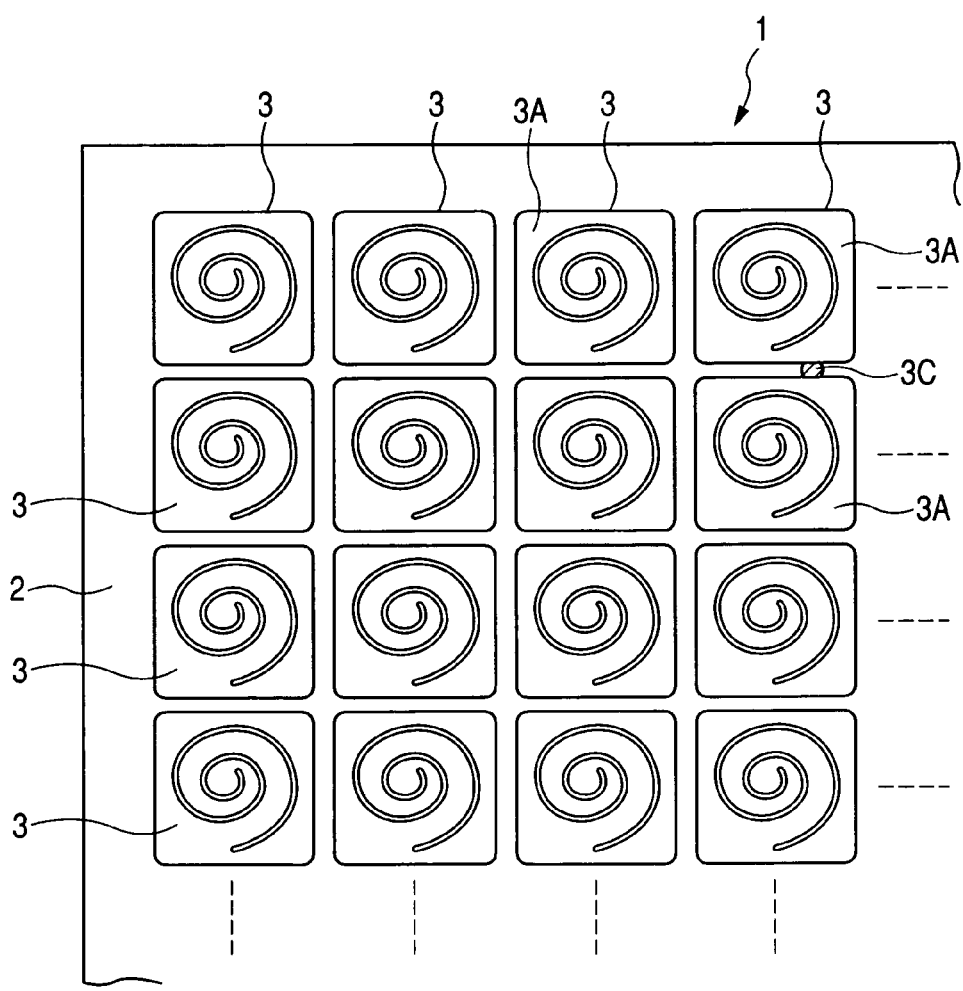
FIG. 7 is a plan view showing a part of a contact sheet having a spiral contactor of a related art.

As a result, the spiral contactors 10 adjacent in the row direction are not fixed on the guide frame 21 in a state in which the supporting portions 11 thereof are close to each other. In addition, even in the spiral contactors 10 adjacent in the column direction, the supporting portions 11 thereof are not close to each other. That is, a distance between the supporting portions 11 is larger than that of the related art shown in FIG. 7 while the supporting portions 11 of the adjacent spiral contactors 10 are not close to each other in the row and column directions.

Therefore, although the copper plating partially remains on the guide frame by not being entirely removed after the etching process, the distance between the supporting portions 11 is large and the supporting portions 11 are not close to each other, and thus the supporting portions 11 can be prevented from being electrically connected to each other.

In addition, although the adjacent supporting portion 11 and deforming portion 12 are connected by the remaining copper plating, the deforming portion 12 is deformed when the external contactor 51 of the electronic component 50 presses on the deforming portion 12, and thus the copper plating portion can be cut to separate the connection between the supporting portion 11 and the deforming portion 12. Therefore, thereafter, even if a power is applied, damage to the electronic component 50 or interference of the signal can be prevented.

Figure 5:
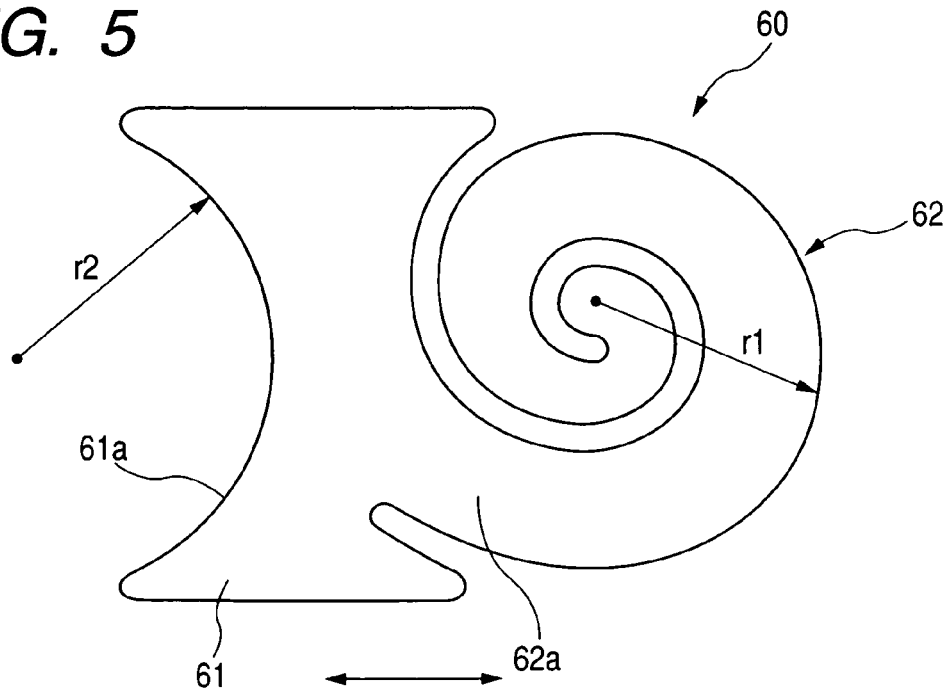
FIG. 5 is a plan view showing a spiral contactor according to a second embodiment of the present invention.
Figure 6:
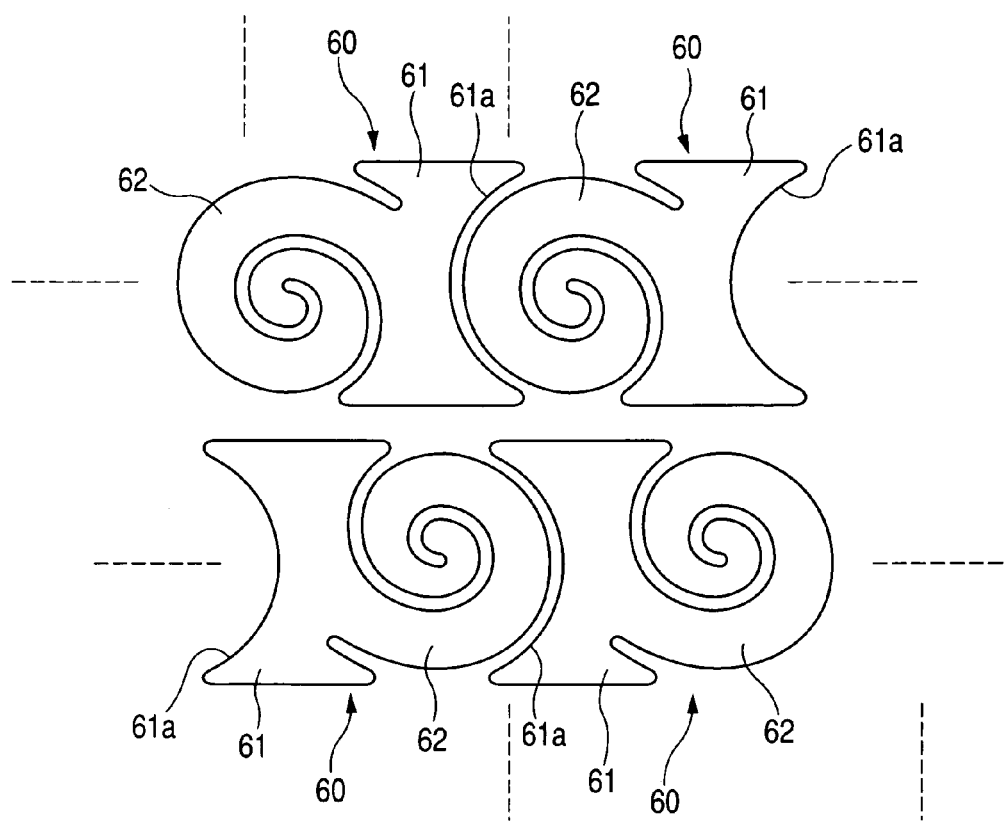
FIG. 6 is a plan view showing a state of arrangement of the spiral contactors of FIG. 5.

FIG. 5 is a plan view showing a spiral contactor according to a second embodiment of the present invention, and FIG. 6 is a plan view showing a state in which the spiral contactors of FIG. 5 are arranged.

A spiral contactor 60 shown in FIG. 5 as the second embodiment has the same structure as the spiral contactor 10 shown in the first embodiment. That is, the spiral contactor 60 has a deforming portion 62 and a supporting portion 61 connected to a winding start portion 62a of the deforming portion 62. The supporting portion 61 is provided only at the winding start portion 62a side (a left side in Figure) and the deforming portion 62 in a right side is opened. However, it is different from the first embodiment in that, at a left end of the deforming portion 62 (a side opposite to the side provided with the deforming portion 12), a concave portion 61a is formed in a direction of the deforming portion 12 (a right direction).

The concave portion 61a is formed along a circular arc having a curvature r2 larger than a curvature r1 of an outermost side of the deforming portion 12. As a result, as shown in FIG. 6, when a plurality of spiral contactors 60 is arranged, at the concave portion 61a in one of adjacent spiral contactors 60, the deforming portion 62 of the other adjacent spiral contactor 60 may be partially arranged. For this reason, the spiral contactors 60 can be arranged in a state in which a distance of the spiral contactors 60 in a row direction becomes decrease, and thus a mounting density per unit area can increase. Therefore, the number of the spiral contactors 60 which can be disposed on the guide frame can increase.

Furthermore, similarly to the first embodiment, the supporting portions 61 of the adjacent spiral contactors 60 in manufacturing can be easily prevented from being connected to each other by a zigzag shape arrangement and, even in the case in which the supporting portion 61 and the deforming portion 62 are connected to each other, the separation thereof can be easily accomplished.

What is claimed is:

1. A spiral contactor comprising:
    a deforming portion extending from a winding start portion provided at an outer circumference side of the deforming portion to a winding end portion provided at an inner circumference of the deforming portion in a spiral shape; and
    a supporting portion connected to the winding start portion provided at the outer circumference side of the deforming portion,
    wherein the supporting portion is provided only at the winding start portion side and an outside of the deforming portion other than the winding start portion side lacks the supporting portion.

2. The spiral contactor according to claim 1,
    wherein a concave portion is formed at a side opposite to a side of the winding start portion provided in the supporting portion and an adjacent deforming portion is partially arranged in the concave portion.

3. A contact sheet having the above-mentioned spiral contactor according to claim 1, further comprising:
    a guide frame formed with a plurality of openings,
    wherein the supporting portion is fixed at a circumference of the opening and the deforming portion is arranged in the opening.

4. The contact sheet according to claim 3,
    wherein rows and columns are formed by a plurality of the spiral contactors arranged at a predetermined pitch, the supporting portions of the spiral contactors arranged in a row direction of one column and the deforming portions of the spiral contactors arranged in a row direction of another column adjacent to the one column are arranged to be opposite to each other.

5. A connecting device having the contact sheet according to claim 3,
    wherein an insulating substrate formed with a plurality of through holes and a contact sheet arranged so as to face at least one surface of the insulating substrate are provided, and
    the supporting portion of the spiral contactor is connected to a connecting portion provided at a circumference of the opening of the through hole.

* * * * *